United States Patent [19]

Bergmann

[11] Patent Number: 4,877,505

[45] Date of Patent: Oct. 31, 1989

[54] METHOD AND APPARATUS FOR APPLICATION OF COATINGS ON SUBSTRATES

[75] Inventor: Erich Bergmann, Mels, Switzerland

[73] Assignee: Balzers Aktiengesellschaft, Fürstenstum, Liechtenstein

[21] Appl. No.: 209,866

[22] Filed: Jun. 22, 1988

[30] Foreign Application Priority Data

Aug. 26, 1987 [CH] Switzerland ............ 03275/87

[51] Int. Cl.⁴ .................................... C23C 14/34
[52] U.S. Cl. .................... 204/192.38; 204/192.12; 204/192.15; 204/298
[58] Field of Search .............. 204/192.11, 192.12, 204/192.15, 192.31, 192.38, 298 D, 298 PI, 298 EE, 298 ME, 298 PM; 427/38

[56] References Cited

U.S. PATENT DOCUMENTS

| | | | |
|---|---|---|---|
| 4,294,678 | 10/1981 | Kuehnle | 204/192.12 |
| 4,346,123 | 8/1982 | Kaufman | 204/192.38 |
| 4,492,845 | 1/1985 | Kljuchko et al. | 204/192.38 X |
| 4,619,748 | 10/1986 | Moll et al. | 204/192.31 |
| 4,655,893 | 4/1987 | Beale | 204/192.31 X |
| 4,740,385 | 4/1988 | Feuerstein et al. | 427/38 |

Primary Examiner—Nam X. Nguyen
Attorney, Agent, or Firm—Notaro & Michalos

[57] ABSTRACT

In order to obtain coatings of greater density and compactness than were possible until now when coating substrates with magnetic field-supported cathode sputtering, a given fraction of metal vapor obtained by vaporization of an electric arc discharge from the anode or cathode is deposited on the functional areas of the substrates together with the sputtered material and, specifically, at least 5 atom percent of the total metal fraction of the coating to be deposited averaged over time is applied by vaporization of an electric arc discharge. A suitable vacuum coating installation for carrying out the method has within a vacuum chamber, a device for vaporizing a part of the coating-forming material with an electric arc discharge and an additional device for magnetic field-supported sputtering of another part of the coating-forming material.

20 Claims, 4 Drawing Sheets

METHOD AND APPARATUS FOR APPLICATION OF COATINGS ON SUBSTRATES

FIELD AND BACKGROUND OF THE INVENTION

The present invention relates in general to vapor deposition methods and equipment and, in particular, to a new and useful method and apparatus for applying coatings in a vacuum chamber which advantageously utilizes both magnetic field-supported cathode sputtering and vaporization by electric spark discharge.

Vacuum coatings have a great variety of applications which include the formation of layered structures on semiconductor components, the optic tempering of lenses, mirrors, and the wear-and-tear and corrosion protection of machine elements and tools. Added to these, are a variety of solutions to specific problems in the fields of mechanical and electrical engineering, which possibly use vacuum coatings. Traditionally, two basic variants of vacuum coatings exist. One of these is the chemical coating process in which the volatile compounds of all elements forming the coating are introduced into a chamber and are brought to react on the surface of the substrate by suitable means such as temperature increase, electrical plasma or light. The other is the physical coating process, wherein, by contrast, first at least, the metal components of the elements which are intended to form the coating are converted to the vapor form in the vacuum of a chamber and, subsequently, condensation takes place on the substrates. By introducing appropriate reactive gases, condensed coatings of oxides, sulfides, carbides, nitrides, silicides, borides and their mixed compounds, such as carbonitrides, can also be obtained. In contrast to the chemical coating processes here, only the metalloid components in the gaseous state are introduced into the coating chamber. In other physical coating processes, in turn, the compounds forming the desired coating, the oxides, fluorides or sulfides, are converted to the vapor form in the vacuum of the chamber.

The present invention pertains to a method and apparatus for physical coating.

For converting the solid coating material into the vapor form, two procedures have proven themselves (see *Thin Film Processes*, Vossen J. K. and Kern W. eds. Academic Press 1978); specifically, sputtering of cathodes in a plasma through impinging ions and heating of the vaporization material, in the process of which it melts and either vaporizes or sublimates.

Regarding cathode sputtering, it had previously been found that magnetic fields with flux lines near the cathode that are orthogonal to the electric field lines, are capable of lowering the sputtering voltage significantly and of increasing the yield, that is, the mass of coating material carried off per unit of energy.

The most diverse devices for vaporizing or sublimating have already been developed, e.g., heated little boats, high-voltage electron guns and, especially during the last few years, devices for vaporizing the electrodes of arc discharge devices.

For carrying out the present invention, those vaporization methods are of interest, in which one of the two electrodes is vaporized in an arc discharge and sublimated off. Magnetic field-supported cathode sputtering is also relevant to the present invention.

In spite of the great variety of coating methods, numerous problems in the field of coating technology still remain. For example, it is still not possible to prepare compact isotropic, extremely fine distributions of several components. Similarly, it is still impossible to produce good and smooth coatings of ternary or polynary compounds with more than one metal component. Added to these two large problem groups, which prevent realization of numerous applications, are a host of individual problems which are well known to the skilled artisan and for which the present invention offers a solution which will become clear from the following.

Currently, there are essentially three methods of vaporizing or sublimating electrodes by arc vaporizations (see U.S. Pat. Nos. 4,197,175 to E. Moll and 4,556,471 to C. Bergmann et al).

In the method in which metal vapor is vaporized or sublimated by a cathode spot (spark) moving on a cooled cathode of an arc discharge, subsequently referred to briefly as cathode spot vaporization, splashing occurs which can only be avoided by simultaneously continuously coating the cathode surfaces reactively during vaporization under high residual gas pressure with a compound (see Swiss patent application Ser. No. 00 841/87-1), or in that through suitable magnetic fields the arc is established at low power, which, however, limits economical advantages. Coatings with splashes have proven to be unsuitable for most applications.

In the method in which the metal vapor is generated by creating a dense plasma with a heated cathode in an ionization chamber from which a low-voltage arc is drawn onto a crucible containing the material to be vaporized, in order to heat it with the energy of its impinging electrons and so to supply the requisite metal vapor, only few metals are suitable as anode material, since the generation of heat at the anode most often is not sufficient to melt most metals.

In a further method in which the metal vapor is generated between a cooled cathode and a smaller anode, an arc discharge with such high current density is generated that the anode is vaporized or sublimated with this vapor being sufficient to maintain the plasma in the positive column of the arc discharge. No success has been achieved in constructing vaporizers using this method that are stable over time and which would permit industrial coating with this source alone.

Cathode sputtering, in many cases, also does not lead to compact coatings (see U.S. Pat. No. 4,557,981 to E. Bergmann) and conducting the process with reactive methods is here difficult. Often, reactive sputtering in its present form yields submicroscopic coatings, which cannot be used for some applications.

SUMMARY OF THE INVENTION

The present invention is based on the problem of manufacturing more compact, denser coatings than appeared possible until now, using cathode sputtering.

According to the present invention, coating material is converted to the gaseous or vapor state in a vacuum chamber with at least two different devices and is deposited on a substrate to form a coating. Magnetic field-supported cathode sputtering serves to convert part of the material to be vaporized, and conversion of another part of the material is brought about by an electrical arc discharge. Averaged over time, at least five percent of the atoms of the metal fraction to be applied to the functional areas of the substrate is derived from the conversion of electrode material of the arc discharge device to the vapor state.

The invention also comprises an apparatus for practising the inventive method.

It has been shown that by using this method, surprisingly, coatings having greater density and compactness can be obtained.

Evidently, due to a synergistic effect, the combination of an arc vaporization method and a specific cathode sputtering method solves the mentioned problems of both and, with it, compensates by far, for the necessity, which initially seemed to be an added complication and disadvantage, of using two different methods for converting the coating material to a vaporous or gaseous state. This compensation gain goes so far that in many cases, in which one of the known methods in its simple form is not enough to achieve usable coating for an intended application, it is of greater advantage to use the method according to the invention, which initially appeared complicated with two different vapor sources than attempting to achieve corresponding improvements through a particular design of the vaporization or cathode sputtering technique alone.

For selecting the optimum fraction of metal vapor which is to be taken from the vaporization of the electroides in the arc discharge, certain criteria must be followed which will be explained in greater detail in conjunction with examples disclosed below. In general, the requisite fraction of this vapor is primarily a function of the material which is to be deposited as coating. In precipitating very refractory metals, for example, a greater fraction of vapor from the arc discharge is required in order to produce compact coatings than is the case with coatings of low temperature melting metals. Here too, it applies that the lower the temperature of the substrate during coating, the greater must be the fraction of vapor from the arc discharge. A guide line can be the theory regarding cathode sputtering coating by John A. Thornton, "J. Vac. Sci. Technol.", Vol. 11, No. 4, July/August 1974. What is surprising is that the fraction of arc discharge vapor can be much lower than could have been expected. By using a reactive residual gas atmosphere in the vacuum chamber during deposition of the coating, the fraction of arc discharge vapor will be selected to be higher, the higher the activation energy of the oxidation reaction of the metal which is intended to form a compound with the metalloid. It has been shown, in general, that a fraction of 5% vapor from the arc discharge is already sufficient in order to allow the coatings to become compact, which, if they were to be produced with pure cathode sputtering, would show a spiky structure. Greater fractions could be necessary if the demands made of the coatings are higher (for example, where isotropy in the range of 10 nm is demanded).

It is obviously clear to the skilled artisan that the necessary fraction of arc discharge electrode vapor refers only to the functional areas to be coated. In general, a structural part will have three kinds of areas, specifically those on which the coatings must fulfill a specific function, other areas on which no coating may be deposited because the properties of the basic material on the surface are needed, and areas on which the coating and the quality of the coating play a lesser role or none at all.

Nevertheless, it is not always possible to build vacuum deposition units so that the functional areas to be coated are exposed at each point in time to the vapor from the vaporization or the sublimation of the cathode or anode of an arc discharge, as well as also to the sputtered material originating from the sputtering source. It has been shown, however, that it is sufficient if the substrates are exposed alternately and rapidly at least to one vaporizing arc discharge electrode and to the sputtering source. In the case of such alternating exposure, it must be ensured that by controlling the apparatus the periods during which the deposition of metal vapor on the functional areas to be coated derives to the extent of more than 95 of 100 parts, from the magnetic field-supported cathode sputtering, are so short that in each instance during the interval periods, a partial coating of no more than 30 nanometer thickness is deposited. The high scattering power of many known devices for arc discharge vaporizers facilitates maintaining these conditions.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
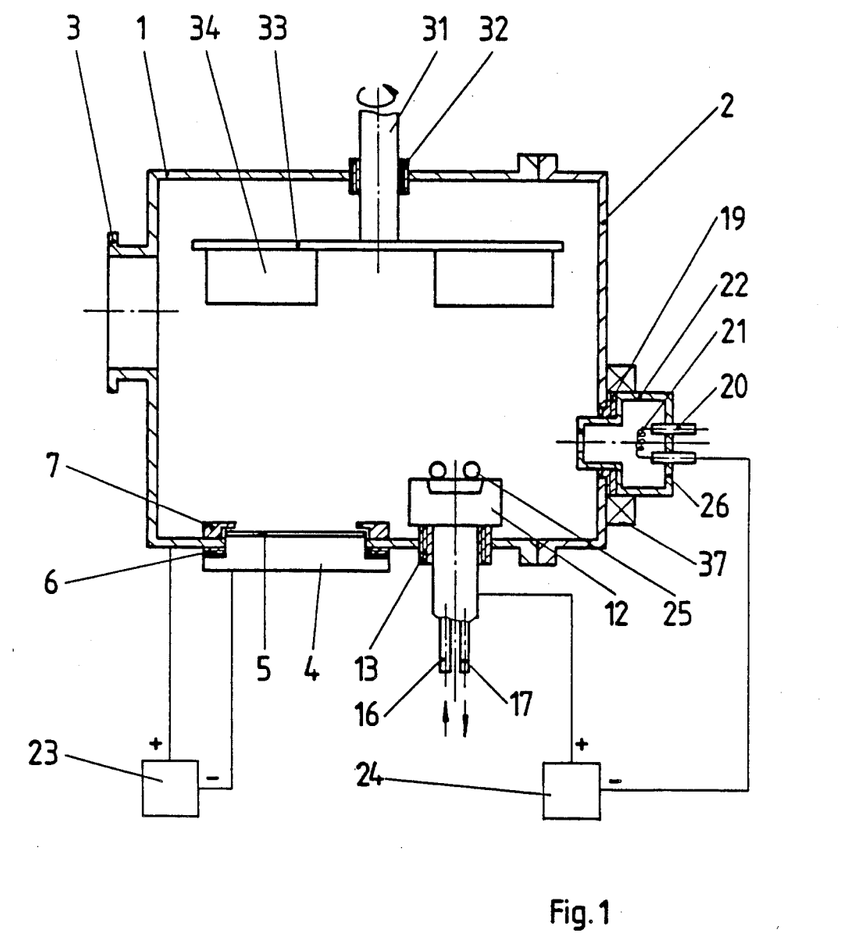
FIG. 1 is a sectional view showing first, a simple embodiment of an arrangement for carrying out the method according to the invention, in which several stations for magnetic field-supported cathode sputtering and one or more stations for electric arc vaporization are arranged next to each other on the floor of a vacuum coating chamber.

With the unit according to FIG. 1, it is possible to coat substrates continuously through vaporization of an anode of an arc discharge apparatus, as well as through vaporization from magnetic field-supported cathode sputtering. The coating or vacuum chamber is built as a rectangular chamber 1, that is evacuated by way of a pump stand (not shown), which is connected to a flange 3, that extends around a vacuum outlet of the chamber. An ionization chamber 22 is flanged to a side wall 2 of the coating chamber for carrying out a so-called low-voltage arc discharge. Ionization chamber 22 is insulated from side wall 2 by insulating rings 19. Current lead-throughs 20 provide electrical power to a filament 21 in ionization chamber 22. A vaporization crucible 12 serves as anode for this discharge. Crucible 12 is electrically insulated from the chamber 1 by flanges 13 of an insulating material and is cooled by water flowing through coolant lines 16 and 17. The material to be vaporized 25 is placed in crucible 12. One of the two connections needed for arc discharge is connected to the positive pole of an arc discharge feeder or power unit 24. The crucible is heated during operating by electrons impinging on it from the low-voltage arc discharge. Further details regarding the construction of a low-voltage arc vaporization station are explained, for example, in Swiss patent No. 631,743. The magnetic field of one or more coils 37 serves to focus the arc.

A station for magnetic field-supported cathode sputtering is arranged on the floor of the vacuum chamber 1 next to vaporization source 12. The station has a cooled basic body 4 which contains the requisite magnetic system. A sputtering target 5 is fastened on the side of body 4, facing the vacuum chamber. The basic body is insulated from the chamber in a manner know per se, through a ring 6 and is connected to the chamber wall. The plasma of the cathode sputtering discharge is confined by an anode 7, which can be connected to the shell or chamber wall so as to be conducting. During operation, the target material is vaporized and deposited on substrates 34 which are arranged on a rotating plate 33 in the chamber. The rotation of the rotating plate on its shaft 31 and around its axis ensures that the substrates are exposed equally to both vapor sources. Plate 33 is electrically insulated from the chamber wall through an interpiece or bushing 32 so that, should it be desirable, an electric bias can be applied to the substrates. For details regarding the construction of magnetic field-supported cathode sputtering devices, see, for example, U.S. Pat. No. 4,166,018.

Figure 2:
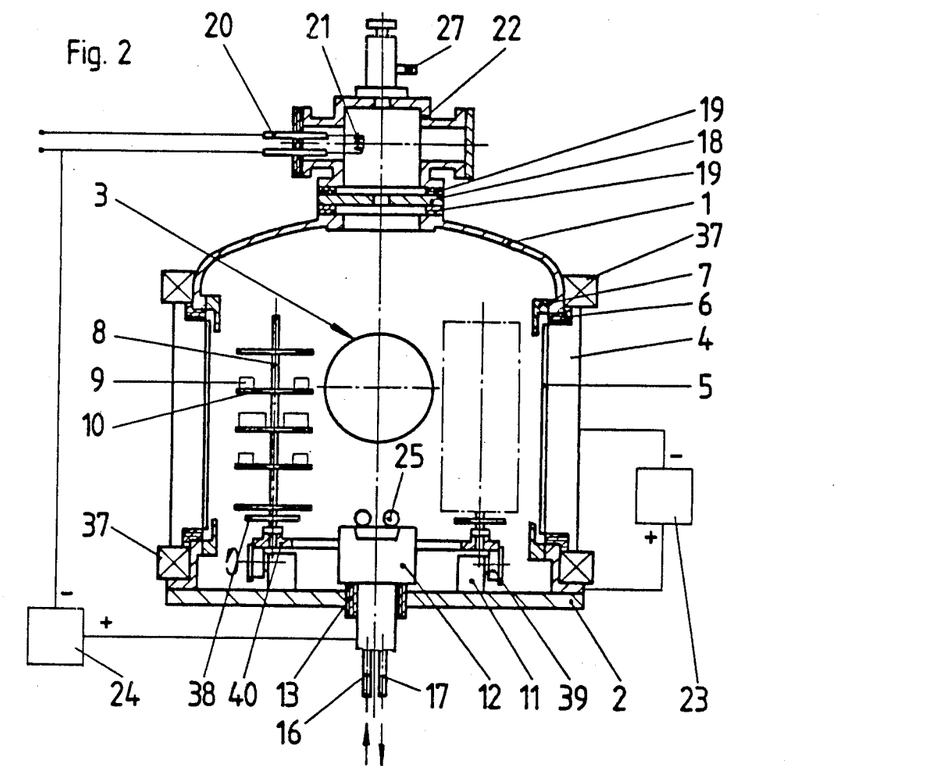
FIG. 2 is a view similar to FIG. 1, of a further coating installation, in which a plurality of cathode sputtering devices fashioned as so-called sputtering magnetrons are arranged around a central low-voltage arc vaporization device.
Figure 2A:
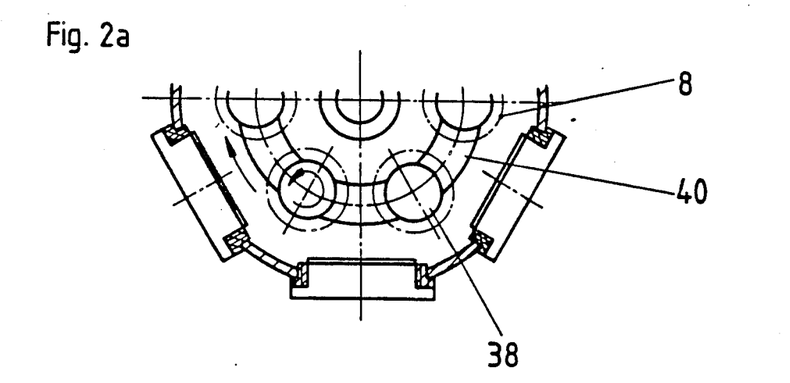
FIG. 2a is a partial transverse sectional view of FIG. 2.

In FIGS. 2 to 4, similar parts carry the same reference numerals as in FIG. 1. FIG. 2 shows a further preferred embodiment of an installation according to the invention. In it, several sources for magnetic field-supported cathode sputtering are combined with a central arc vaporization device and an ionization chamber for operating the arc. A shell 1 is placed on a base plate 2 and forms together with it, the vacuum chamber. On the sides of the shell, five flanges are provided. One sputtering magnetron 4 for magnetic field-supported cathode sputtering is connected to each flange (FIG. 2a shows three such units). They are electrically insulated from the chamber by an intermediary flange 6 of a suitable insulating material. A target 5 is fastened on the side facing the interior space of each sputtering magnetron, for example, by clamping. Each target 5 consists of the material which is intended to constitute part of the coating. The numerous possibilities for such connections are described in the technical literature.

The experiments described in the methodological examples below were carried out with directly cooled targets. The plasma of the cathode sputtering discharge was confined by an anode 7, which can be connected to the shell wall so as to conduct electricity. Each of these sputtering stations is individually connected to a direct current source or feeder unit 23.

In the installation of FIG. 2, the ionization chamber 22 is placed on the vacuum chamber and separated from the main chamber 1 by an aperture plate 18, which is mounted so as to be insulated by insulating rings 19, 19. The insulated aperture plate between the ionization chamber 22 and the coating chamber 1 restricts the plasma exchange between the two chambers. In the ionization chamber, a filament 21 of a suitable refractor alloy, for example, tungsten or tantalum, is provided, which can be connected to a heating current supply through current lead-throughs 20. One of the two connections is connected to the negative pole of the arc discharge feeder or power unit 24. The rare gas required for the discharge is introduced into the ionization chamber through an inlet line 27. The manner of function and further details of design and operation of devices for carrying out a low-voltage arc discharge and magnetic field-supported cathode sputtering are known from Swiss patent No. 631,743 or U.S. Pat. No. 4,166,018. The evacuation of the installation takes place through a flange 3 for the connection of a pump stand. For arc vaporization, further, a crucible 12 is required, which is provided with a cooling device with connecting ducts 16 and 17 for supplying and carrying off a coolant and electrically insulated by a flange of insulating material 13 from the remaining installation. Crucible 12 is connected to the positive pole of the arc discharge-direct voltage feeder unit 24.

For vaporizing a part of the coating-building material, pieces 25 of this material, for example, in tablet form, are placed into the crucible and the low voltage arc discharge is focussed on them with an axial magnetic field. The magnetic field is generated by coils 37, which are provided for that purpose. Substrate carriers 8 are arranged between the vaporization crucible 12 and the sources 4 for the magnetic field-supported cathode sputtering. Six such carriers are, for example, provided.

On each of these carriers, plates 10 are, for example, fastened which, in turn, carry the substrates 9. The carriers are continuously guided during the coating process on a circular path around the low-voltage arc and simultaneously past the sputtering sources arranged on the cylindrical chamber wall. For this purpose, a so-called revolving or rotary stand 38 can be used, which consists, for example, of a horizontal ring 40 rotatably supported on rollers 39 on which the vertical carriers 8 are mounted and which is driven by a motor 11. It is also advisable to simultaneously set the substrate plates into continuous or intermittent rotation around their vertical axes while they are rotating on a circular path in order to achieve uniform coating of all substrates arranges on each plate.

FIG. 2a, a partial section of FIG. 2, makes it evident that overall in this installation, there is room for five sputtering magnetrons, together with the suction connecting flange, or piece 3 at the side walls of the shell, and a rotary stand with six supporting columns for substrate plates.

Instead of the low-voltage arc vaporization device in FIG. 2, one or several of the available flanges on the wall can be equipped with cathode spot vaporizers.

Figure 3:
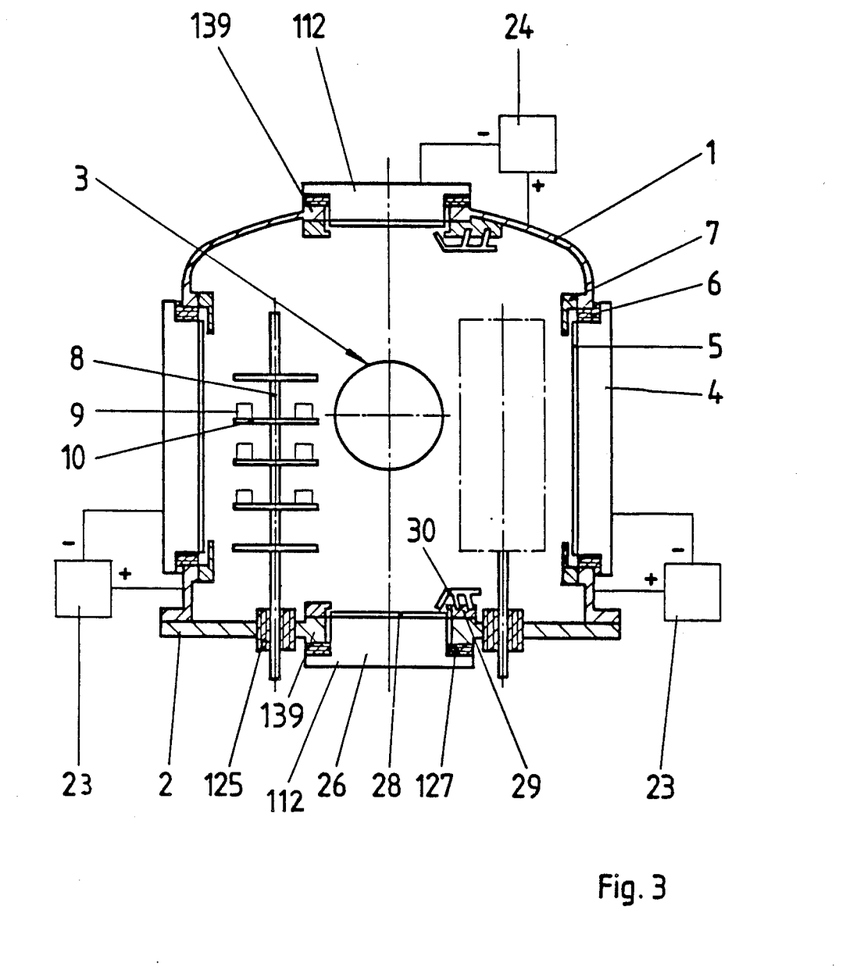
FIG. 3 is a view similar to FIG. 2, in which, however, instead of a low-voltage arc vaporizer, a so-called cathode spot vaporizer is employed, in which material is vaporized from the cathode in an electric arc discharge.

FIG. 3 shows a further installation again with five flanges for sputtering magnetrons 4 on the cylindrical part of the shell. Flanges 139 are welded to the bottom and to the ceiling of the chamber 1. A station for arc discharge cathode spot vaporization 112 is fastened to each flange 139. They each comprise a water-cooled basic body 26 which is insulated from the chamber wall in accordance with principles of spark technology. Details regarding the way in which this insulation 127 must be carried out are known to the specialist (for example, see U.S. Pat. Nos. 4,430,184 to W. M. Mularie and 4,556,471 to C. Bergmann et al.). On the sides facing the interior of the chamber, plates 28 of the cathode material to be vaporized are located. Added to this is one trigger device 30, for each unit. The details of this design are also known to the skilled artisan (C. Bergmann et al, German patent application No. OS 34 13 728). Power is supplied to the two cathode spot arc vaporizers by one welding generator 24 each. Its anode can either, as shown in the illustration, be connected to the shell wall or be formed as part of the insulation 29 between cathode and shell. In front of each station 4 for magnetic field-supported cathode sputtering is an axis-shaped carrier 8 which is electrically separated from the base plate 2 by an insulation 125. On it are placed the work pieces 9 to be coated, for example, on intermediate plates 10. Their rotation around their own axis is selected to be of such speed that the function of the power placed on the targets and the arc electrodes can fulfill a 30 nanometer condition wherein periods during which metal vapor is deposited on the functional areas of the substrate is applied to an extent of more than 95 out of 100 parts from the magnetic field-supported cathode sputtering, are so brief that during these periods, no more than 30 nanometer thick coatings are deposited on these functional areas.

Figure 4:
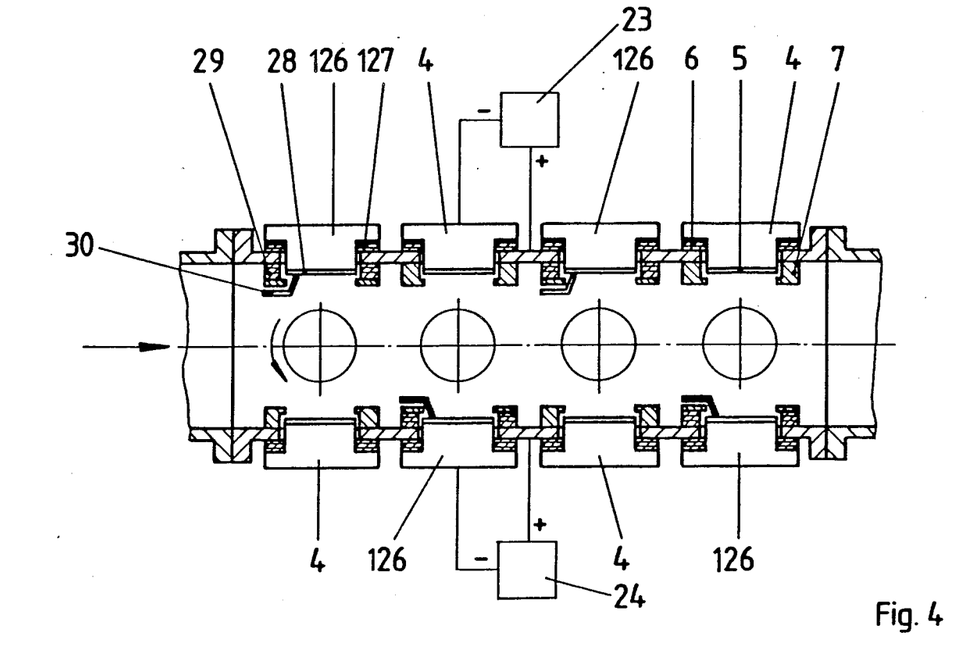
FIG. 4 is a sectional view, schematically showing the structure of a continuous coating installation with a plurality of sputtering magnetrons and cathode spot vaporizers, which, opposing each other in one and the same vacuum chamber, provide alternating coating of the passing substrates by cathode sputtering and by magnetic field-supported low-voltage discharge.

The installation shown in FIG. 4 is, as mentioned above, a continuous installation in which the substrates can be continuously introduced into the coating chamber, be guided through the coating zone and, after the coating operation, can again be carried out of the chamber. Only the actual coating chamber with four sputtering magnetrons 4 and four cathode spot vaporizers 126 is shown, with one sputtering magnetron and one spark vaporizer each being arranged opposing each other. The speed at which the substrates pass through when the method is carried out is to be selected so that the "30 nm condition", as noted above, can be met.

Below, several examples for carrying out the method are given:

EXAMPLE I

In a first methodological example, the task consisted in preparing coatings of $Ti_{0.6}Al_{0.4}N$, in such a way that they are suitable as coatings for the purpose of extending the service life of cutting tools. As the test method, the drilling of 8 mm deep pocket bores, with diameter 6 mm, in gray cast iron casting, GG 30, was selected. The drilling conditions were cutting speed 30 m/minute, advance 0.2 mm/rotation. Under these conditions, with a pure titanium nitride coating of 3 $\mu$m thickness, deposited conventionally with a low-voltage arc, 120 bores can be drilled before wear and tear becomes so great that the quality of the bores lies outside quality requirements. Experiments involving vaporizing an alloy of titanium and aluminum failed.

In a further preliminary test, four stations of an installation for magnetic field-supported cathode sputtering were equipped with titanium targets and four additional stations with aluminum targets. Sputtering was carried out in an argon nitrogen mixture and, in such a way, that, on the drills 3 $\mu$m $Ti_{0.6}Al_{0.4}N$ was deposited. In spite of all attempts at optimizing sputtering, the coating showed undesirable spiky growth patterns and the drilling test had to be discontinued after 15 bores.

Subsequently, the drills were coated using the method according to the present invention, specifically, as follows:

Four stations for magnetic field-supported cathode sputtering of the installation were equipped with titanium targets and four stations with aluminum targets. The anodically switched vaporization crucible of an arc vaporization device in the same installation was filled with titanium tablets and the revolving stand (available in the installation as the holding arrangement for the substrates) held the drills. Following the customary preliminary preparation steps: pumping, heating, etching, which are known to the skilled artisan, the revolving stand was set into motion, specifically, at a rotational speed of 2 rotations per minute. In the process, the axis holder was rotated every minute by at least 180 degrees with an auxiliary device, such as is described in U.S. Pat. No. 2,912,351. Subsequently, an argon pressure of 0.15 pascal was set in the chamber and an arc was fired between the heating cathode of the low-voltage arc discharge and the crucible with a magnetic field. The current was 120 amperes and the voltage 51 volts. Titanium vaporization from the crucible started in a few seconds, nitrogen was subsequently admitted, specifically, at a rate of 60 standard cubic centimeters per minute. As soon as the nitrogen flow was stabilized, the eight stations for the magnetic field-supported cathode sputtering were switched on and the titanium targets were sputtered with 23 amperes each as were also the four aluminum targets with 20 amperes each. The nitrogen flow was then increased to 250 standard cubic centimeters per minute and, in the process, the total pressure increased to 0.3 pascal. After 24 minutes, coating was discontinued and, on the drills, a 3 $\mu$m coating had been deposited, the composition of which was determined semi-quantitatively with energy dispersive X-ray analysis to be $Ti_{0.6}Al_{0.4}N$. The fraction of the arc-vaporized material could be determined on the basis of a comparison of the deposition rates of titanium nitride under similar conditions. It was 8 atom percent. The drills were tested as above and achieved 170 bores. A check under the raster electron microscope revealed a completely compact coating. In a further test, 160 amperes were selected for the arc current which lead to twice the vaporization rate, and all other conditions were selected identically. The drills were again tested under the same conditions, under which they achieved 190 bores, hence, only an insignificantly greater improvement.

EXAMPLE II

In an additional second example, the task consisted likewise of preparing coatings of titanium nitride in such a way that they are suitable for cutting tools. The test method was the same as in Example I. The drills were coated with the method according to the invention, and, specifically, as follows:

All stations for magnetic field-supported cathode sputtering of the installation were equipped with titanium targets, titanium tablets were placed in the crucible and the revolving stand was filled with drills. Following the customary preparation; pumping, heating, etching (known to the skilled artisan), the revolving stand was turned on specifically at a rotational speed of 2 rotations per minute. At this speed, the rotatable substrate holding means were rotated every minute by at least 180 degrees. An argon pressure of 0.15 pascal was set in the chamber, the filament of the low-voltage arc discharge was switched on and an arc between it and the crucible was fired, and, with a magnetic field, was focused on the crucible. The current was 80 amperes, the voltage 49 volts. Within a few seconds, titanium vaporization from the crucible started. Nitrogen was subsequently introduced, specifically, at 40 standard cubic centimeters per minute. As soon as the nitrogen flow was stabilized, the eight stations present in the employed installation for the magnetic field-supported cathode sputtering were turned on and operated with 23 amperes each, the nitrogen flow was increased to 250 standard cubic centimeters per minute, which raised the total pressure to 0.3 pascal. After 24 minutes of constant coating, all feeder units were switched off and a 3 $\mu$m thick coating of titanium nitride had been deposited on the drills.

On a basis of a comparison of the deposition rate of titanium nitride, under similar conditions, the fraction of the arc-vaporized material could be determined. It amounted to approximately 6 atom percent. The drills were tested as described above and achieved 95 bores. A check under the raster electron microscope showed completely compact coatings. In a comparison test, drills were coated with titanium nitride in the conventional manner with magnetic field-supported cathode sputtering only, and, specifically, also with a coating thickness of 3 $\mu$m. However, these drills failed already after just bore 9.

EXAMPLE III

In Example III, the problem consisted in preparing $Ti_{0.8}V_{0.2}N$ coatings so as to make them suitable for milling. The test conditions selected were:
 finish milling on a linear transfer machine;
 tool SPKN 1203 EDR with 8 teeth, diameter 200 mm;
 material M40;
 cutting speed 150 m/minute;
 advance/tooth 0.53 mm;
 cutting depth 2.3 mm; and
 cutting width 60 mm.

The installation was as described in FIG. 3. Initially, attempts were made to produce these coatings with magnetic field-supported cathode sputtering only. A serviceable life of 280 parts was achieved, the uncoated milling cutters achieved 90 parts. Subsequently, the milling cutters were coated with the method according to the invention. The two cathode spot vaporizers were equipped with titanium targets, six of the stations for magnetic field-supported cathode sputtering with titanium targets, and two with vanadium targets. After the customary preparations, a pressure of 6 pascals in an argon nitrogen mixture at a ratio of 1 to 1 was set in the chamber, subsequently, the cathode spot vaporizers were fired and operated at 60 amperes each. Their voltage was 42 volts. Subsequently, the stations for magnetic field-supported cathode sputtering were switched on, the six stations for sputtering of titanium were operated with 23 amperes, the two stations for sputtering of vanadium with 25 amperes. The pressure was kept constant through an appropriate increase of the gas mixture flow and the revolving stand operated at 3 rotations per minute, corresponding to one rotation of the substrate holder by at least 180 degrees every 40 seconds. After 25 minutes, all feeder units were switched off. A coating that was 5 $\mu$m thick had been deposited on the milling cutters, the composition of which was determined to be $Ti_{0.8}V_{0.2}$. On the basis of a comparison with the deposition rate of arc-vaporized titanium nitride under similar conditions, the fraction of the arc-vaporized material in these coatings could be determined. It was 7%. The milling cutters were tested under the same conditions. The serviceable life was 420 parts. A check under the raster electron microscope indicated completely compact coatings.

EXAMPLE IV

Example IV pertains to the problem of corrosion of structural parts such as are used in many areas of mechanical engineering. Round test bodies of CK45 and a diameter of 40 mm were selected. As test, alternating immersion baths in sea water were selected according to DIN (German Industrial Standards) 50900. The duration of the test was 48 hours. The installation as shown in FIG. 2, was used. The samples were placed on the rotary plates. As targets of the stations for magnetic field-supported cathode sputtering, 18/10 steel was chosen. Five chromium tablets were placed in the crucible, and the processes were all carried out in pure argon. The pressure was 0.3 pascal. Since the sequence of the individual steps is identical to those of the preceding examples, they will not be discussed further. Vaporization with an arc current of 150 amperes, at a sputtering current of 20 amperes led to significantly better corrosion resistance than coating with cathode sputtering alone.

EXAMPLE V

As Example V, self-lubricating coatings of molybdenum disulfide/molybdenum mixture were to be applied on the race of end journal bearings, the usefulness of which, in mechanical engineering, is known. The problem of these coatings is their high wear and tear in tribo-systems with a relative humidity above 85%. Cause of this wear and tear is the lacking compactness, which permits penetration of water through submicroporosity. The installation shown in FIG. 4 was used for coating. Three stations for magnetic field-supported cathode sputtering were equipped with targets of molybdenum disulfide, and one of the stations for cathode spot vaporization with a cathode of molybdenum. The motion of the substrates was linear, with the axis-shaped carriers carrying out a rapid additional rotation of four rotations per minute. After the customary preparations; evacuating, heating and plasma etching, a pressure of 0.5 pascal argon was set in the chamber, the substrate carrier was subsequently set in motion, and the spark cathode fired and operated at 80 amperes arc current. A short time afterwards, the stations for magnetic field-supported cathode sputtering were activated also and operated at a current of 10 amperes. The rate of linear motion was 1 meter per minute. After each passage of the substrates, a coating of 1 $\mu$m had been deposited on the ball bearing races, the composition of which varied between $MoS_{1.9}$ and MoS. The ball bearings, diameter 30 mm, were tested with eight balls of 2.5 mm diameter, and a load of 2 kg at a rotational speed of 300 rotations per minute, under 95% relative air humidity. Their service life was two hours. For comparison, coatings of similar composition were produced under similar conditions with magnetic field-supported cathode sputtering only. Under the just mentioned test conditions, coating losses in the races occurred after only ten minutes.

While a specific embodiment of the invention has been showed and described in detail to illustrate the application of the principles of the invention, it will be understood that the invention may be embodied otherwise without departing from such principles.

I claim:

1. A method for the application of a coating onto a functional area of a substrate, the coating being made of material having a metal fraction consisting essentially of one metal comprising:
   placing the substrate, having the functional area to be coated, in a vacuum chamber;
   converting a portion of said metal into a first vapor in the vacuum chamber and depositing the first vapor onto the substrate by magnetic field-supported sputtering; and
   separately converting a further portion of said metal into a second vapor and depositing the second vapor onto the substrate by electric arc discharge using an electrode made of said metal;
   said functional area of said substrate being exposed substantially during the whole application of the coating simultaneously to both the first vapor from the conversion by magnetic field-supported sputtering and the second vapor from the conversion by electric arc discharge, in such a way, that
   the first vapor from the conversion by magnetic field-supported sputtering and the second vapor from the conversion by electric arc discharge are deposited jointly on the functional area, and substantially throughout the whole coating on the functional area at least five out of one hundred atoms of the metal are derived from the conversion by the electric arc discharge and the remaining atoms are derived from the conversion by the magnetic field-supported sputtering.

2. A method according to claim 1, wherein the metal for the electric arc discharge forms the cathode for the electric arc discharge.

3. A method according to claim 1, wherein the metal of the electric arc discharge forms the anode for the electric arc discharge.

4. A method according to claim 1, including providing a reactive atmosphere in the vacuum chamber during the coating of the substrate.

5. A method for the application of a coating onto a functional area of a substrate, the coating being made of material having a metal fraction consisting essentially of one metal, comprising:
   placing the substrate, having the functional area to be coated, in a vacuum chamber;
   converting a portion of said metal into a first vapor in the vacuum chamber and depositing the first vapor onto the substrate by magnetic field-supported sputtering; and
   separately converting a further portion of said metal into a second vapor and depositing the second vapor on the substrate by an electric arc discharge using an electrode made of said metal;
   said functional are of said substrate being exposed substantially during the whole application of the coating substantially alternately to both the first vapor from the conversion by magnetic field-supported sputtering and the second vapor from the conversion by electric arc discharge, in such a way, that
   at least five out of one hundred atoms of the metal of the whole coating on said functional area are derived from the conversion by the electric arc discharge and the remaining atoms are derived from the conversion by the magnetic field-supported sputtering, and
   within the whole coating on said functional area no more than 30 nanometer thick layers exist, in which more than ninety-five out of one hundred parts of the metal comes from the magnetic field-supported sputtering.

6. A method according to claim 5, wherein the metal for the electric discharge forms the cathode for the electric arc discharge.

7. A method according to claim 5, wherein the metal for the electric arc discharge forms the anode for the electric arc discharge.

8. A method according to claim 5, including providing a reactive atmosphere in the vacuum chamber during the coating of the substrate.

9. A method for the application of a coating onto a functional area of a substrate, the coating being made of material having a metal fraction consisting essentially of a plurality of metals, comprising:
   placing the substrate, having the functional area to be coated, in a vacuum chamber;
   converting a portion of at least one of the metals of said plurality of metals into a first vapor in the vacuum chamber and depositing the first vapor onto the substrate by magnetic field-supported sputtering; and
   separately converting a further portion of at least one of the metals of said plurality metals into a second vapor and depositing the second vapor on the substrate by an electric arc discharge using an electrode made of at least one of the metals;
   said functional area of said substrate being exposed substantially during the whole application of the coating simultaneously to both the first vapor from the conversion by magnetic field-supported sputtering and the second vapor from the conversion by electric are discharge, in such a way, that
   the first vapor from the conversion by magnetic field-supported sputtering and the second vapor from the conversion by electric arc discharge are deposited jointly on the functional area, and substantially throughout the whole coating on the functional area at least five out of one hundred atoms of the metal fraction are derived from the conversion by the electric arc discharge and the remaining atoms are derived from the conversion by the magnetic field-supported sputtering.

10. A method according to claim 9, wherein the metal for the electric arc discharge forms the cathode for the electric arc discharge.

11. A method according to claim 9, wherein the metal for the electric arc discharge forms the anode for the electric arc discharge.

12. A method according to claim 9, including providing a reactive atmosphere in the vacuum chamber during the coating of the substrate.

13. An apparatus for coating the functional area of a substrate with a meterial having a metal fraction, comprising:
   a vacuum chamber for receiving the substrate;
   first means in the vacuum chamber for vaporizing a part of the coating forming material by electric arc discharge;
   second means in said vacuum chamber for forming another part of the material into vapor and depositing the vapor onto the substrate by magnetic field-supported sputtering, said second means comprising a plurality of cathode sputtering devices in said vacuum chamber arranged around a central arc vaporization device forming said first means; and holding means for holding a plurality of substrates in a position between said central arc vaporization device and said plurality of cathode sputtering devices;

said holding means comprising a vertical substrate holding shaft carrying a plurality of vertically spaced plates each for carrying a plurality of substrates, a horizontal ring for rotatably supporting each of said vertical shafts, and means for rotatably supporting and driving said horizontal ring in said vacuum chamber, said horizontal ring being disposed around said central arc vaporization device and being surrounded by said plurality of cathode sputtering devices.

14. An apparatus according to claim 13, including means for alternately activating said first and second means, at least one per minute for alternating the formation of the coating between arc discharge vaporization and sputtering vaporization.

15. An apparatus according to claim 13, wherein said central arc vaporization device comprises an ionization chamber at the top of said vacuum chamber and a crucible at the bottom of said vacuum chamber, said cathode sputtering devices being circumferentially spaced around said vacuum chamber at a horizontal position between said ionization chamber and said crucible.

16. An apparatus for coating the functional area of a substrate with a material having a metal fraction, comprising:

a vacuum chamber for receiving the substrate;

first means in the vacuum chamber for vaporizing a part of the coating forming material by electric arc discharge; and second means in said vacuum chamber for forming another part of the material into vapor and depositing the vapor onto the substrate by magnetic field-supported sputtering, said second means comprising a plurality of cathode sputtering devices in said vacuum chamber arranged around a central arc vaporization device forming said first means; and holding means for holding a plurality of substrates in a position between said central arc vaporization device and said plurality of cathode sputtering devices;

said vacuum chamber having a top wall, a bottom wall and a circumferential side wall, said arc vaporization device being positioned in at least one of said top and bottom walls and said plurality of cathode sputterng devices being circumferentially spaced around said side wall, said arc vaporization device comprising a water cooled basic body connected through and insulated from said one of said top and bottom wall of said vacuum chamber, a trigger device mounted adjacent said water-cooled basic body, and a direct current power supply having one pole connected to said basic body and another pole connected to said trigger device.

17. An apparatus according to claim 16, including means for alternately activating said first and second means, at least one per minute for alternating the formation of the coating between arc discharge vaporization and sputtering vaporization.

18. An apparatus for the application of a coating onto a functional area of a substrate, the coating being made of material having a metal fraction including at least one metal, comprising:

a vacuum chamber for receiving the substrate and for exposing the functional area to be coated;

first conversion means in the vacuum chamber for converting a portion of at least one metal into a first vapor in the vacuum chamber and for depositing the first vapor onto the substrate by magnetic field-supported sputtering, the vacuum chamber being constructed and the first conversion means being positioned in the vacuum chamber so that the first vapor has free access to the functional area of the substrate in the vacuum chamber;

second conversion means in the vacuum chamber spaced from the first conversion means for separately converting a further portion of at least one metal into a second vapor and for depositing the second vapor onto the substrate by an electric arc discharge using an electrode made of the at least one metal, the vacuum chamber being constructed and the second conversion means being positioned in the vacuum chamber so that the second vapor has free access to the functional area on the substrate; and activation means operatively connected to said first and second conversion means for simultaneously activating said first and second converting means for exposing the functional area of the substrate substantially during the whole application of the coating simultaneously to both the first vapor and the second vapor, said activation means activating said first and second conversion means for jointly depositing the first vapor and the second vapor onto the functional area so that substantially throughout the whole coating of the functional area at least five out of one hundred atoms of the metal are derived from the conversion by the electric arc discharge and the remaining atoms are derived from the conversion by the magnetic field-supported sputtering.

19. An apparatus for the application of a coating onto a functional area of a substrate, the coating being made of material having a metal fraction including at least one metal, comprising:

a vacuum chamber for receiving the substrate and for exposing the functional area to be coated;

first conversion means in the vacuum chamber for converting a portion of at least one metal into a first vapor in the vacuum chamber and for depositing the first vapor onto the substrate by magnetic field-supported sputtering, the vacuum chamber being constructed and the first conversion means being positioned in the vacuum chamber so that the first vapor has free access to the functional area of the substrate in the vacuum chamber;

second conversion means in the vacuum chamber spaced from the first conversion means for separately converting a further portion of at least one metal into a second vapor and for depositing the second vapor onto the substrate by an electric arc discharge using an electrode made of the at least one metal, the vacuum chamber being constructed and the second conversion means being positioned in the vacuum chamber so that the second vapor has free access to the functional area on the substrate; and activation means operatively connected to said first and second conversion means for alternately activating said first and second converting means for exposing the functional area of the substrate substantially during the whole application of the coating alternately to the first vapor and the second vapor, said activation means activating said first and second conversion means for alternately depositing the first vapor and the second vapor onto the functional area so that substantially throughout the whole coating of the functional area at least five out of one hundred atoms of the metal are derived from the conversion by the electric arc discharge and the remaining atoms are derived from the conversion by the magnetic field-supported sputtering, and within the whole coating on the functional area no more than 30 nanometer thick layers exist, in which more than ninety-five out of one hundred parts of the metal comes from the magnetic field-supported sputtering.

20. An apparatus for the application of a coating onto a functional area of a substrate, the coating being made of material having a metal fraction including at least one metal, comprising:

a vacuum chamber for receiving the substrate and for exposing the functional area to be coated;

first conversion means in the vacuum chamber for converting a portion of at least one metal into a first vapor in the vacuum chamber and for depositing the first vapor onto the substrate by magnetic field-supported sputtering, the vacuum chamber being constructed and the first conversion means being positioned in the vacuum chamber so that the first vapor has free access to the functional area of the substrate in the vacuum chamber;

second conversion means in the vacuum chamber spaced from the first conversion means for separately converting a further portion of at least one metal into a second vapor and for depositing the second vapor onto the substrate by an electric arc discharge using an electrode made of the at least one metal, the vacuum chamber being constructed and the second conversion means being positioned in the vacuum chamber so that the second vapor has free access to the functional area on the substrate; and activation means operatively connected to said first and second conversion means for simultaneously activating said first and second converting means, and means for rotating the substrate past said first and second conversion means for exposing the functional area of the substrate substantially during the whole application of the coating alternately to the first vapor and the second vapor, said activation means activating said first and second conversion means for depositing the first vapor and the second vapor onto the functional area so that substantially throughout the whole coating of the functional area at least five out of one hundred atoms of the metal are derived from the conversion by the electric arc discharges and the remaining atoms are derived from the conversion by the magnetic field-supported sputtering, and within the whole coating on the functional area no more than 30 nanometer thick layers exist, in which more than ninety-five out of one hundred parts of the metal comes from the magnetic field-supported sputtering.

* * * * *